(12) United States Patent
Vigil et al.

(10) Patent No.: US 7,578,046 B2
(45) Date of Patent: Aug. 25, 2009

(54) SMALL FORM FACTOR PCBA PROCESS CARRIER

(75) Inventors: JoAnn C. Vigil, Longmont, CO (US); Robert Gibson-Taylor, Firestone, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 75 days.

(21) Appl. No.: 11/683,537

(22) Filed: Mar. 8, 2007

(65) Prior Publication Data
US 2007/0209828 A1 Sep. 13, 2007

Related U.S. Application Data

(60) Provisional application No. 60/780,238, filed on Mar. 8, 2006.

(51) Int. Cl.
*B23P 21/00* (2006.01)
(52) U.S. Cl. .................. 29/564; 29/564.1; 29/564.2; 29/564.6
(58) Field of Classification Search ................ 29/593, 29/564, 564.1, 564.2, 564.6, 739, 740, 741
See application file for complete search history.

(56) References Cited

U.S. PATENT DOCUMENTS

| | | | |
|---|---|---|---|
| 4,256,296 A | 3/1981 | Scheinert | |
| 4,759,488 A | 7/1988 | Robinson et al. | |
| 4,850,104 A | 7/1989 | Matrone et al. | |
| 4,933,808 A * | 6/1990 | Horton et al. | 361/715 |
| 5,067,648 A | 11/1991 | Cascini | |
| 5,276,961 A * | 1/1994 | Matta et al. | 29/827 |
| 5,596,282 A * | 1/1997 | Giddings et al. | 324/754 |
| 5,782,400 A | 7/1998 | Susicki | |
| 5,794,784 A * | 8/1998 | Murphy | 206/725 |
| 5,881,453 A * | 3/1999 | Avery et al. | 29/834 |
| 5,890,599 A * | 4/1999 | Murphy | 206/725 |
| 5,920,192 A * | 7/1999 | Kiyokawa | 324/158.1 |
| 5,932,065 A | 8/1999 | Mitchell | |
| D426,524 S | 6/2000 | Abed et al. | |
| 6,164,636 A | 12/2000 | Taylor | |
| 6,295,728 B1 | 10/2001 | Shin et al. | |
| 6,304,073 B1 * | 10/2001 | Saito | 324/185.1 |
| 6,378,857 B1 | 4/2002 | Taylor | |
| 6,780,039 B2 * | 8/2004 | Wang | 439/342 |
| 6,799,714 B2 | 10/2004 | Gleason | |
| 6,945,445 B2 | 9/2005 | Luo | |
| 6,996,898 B2 | 2/2006 | Peckham et al. | |

* cited by examiner

*Primary Examiner*—C. J Arbes
(74) *Attorney, Agent, or Firm*—Leanne Taveggia Farrell; Westman, Champlin & Kelly, P.A.

(57) ABSTRACT

A process carrier is capable of supporting printed circuit boards during manufacturing and testing. The process carrier includes a base plate, a first top plate and a second top plate. The base plate has an upper surface including a recessed area sized to receive a panelized group of printed circuit board substrates and a lower surface. The first top plate is coupleable to the upper surface of the base plate during a first manufacturing process. The first top plate includes a plurality of connected rails configured to secure the panelized group of printed circuit board substrates. The second top plate is coupleable to the upper surface of the base plate during a second manufacturing process. The second top plate is configured to cover the panelized group of printed circuit board substrates.

19 Claims, 6 Drawing Sheets

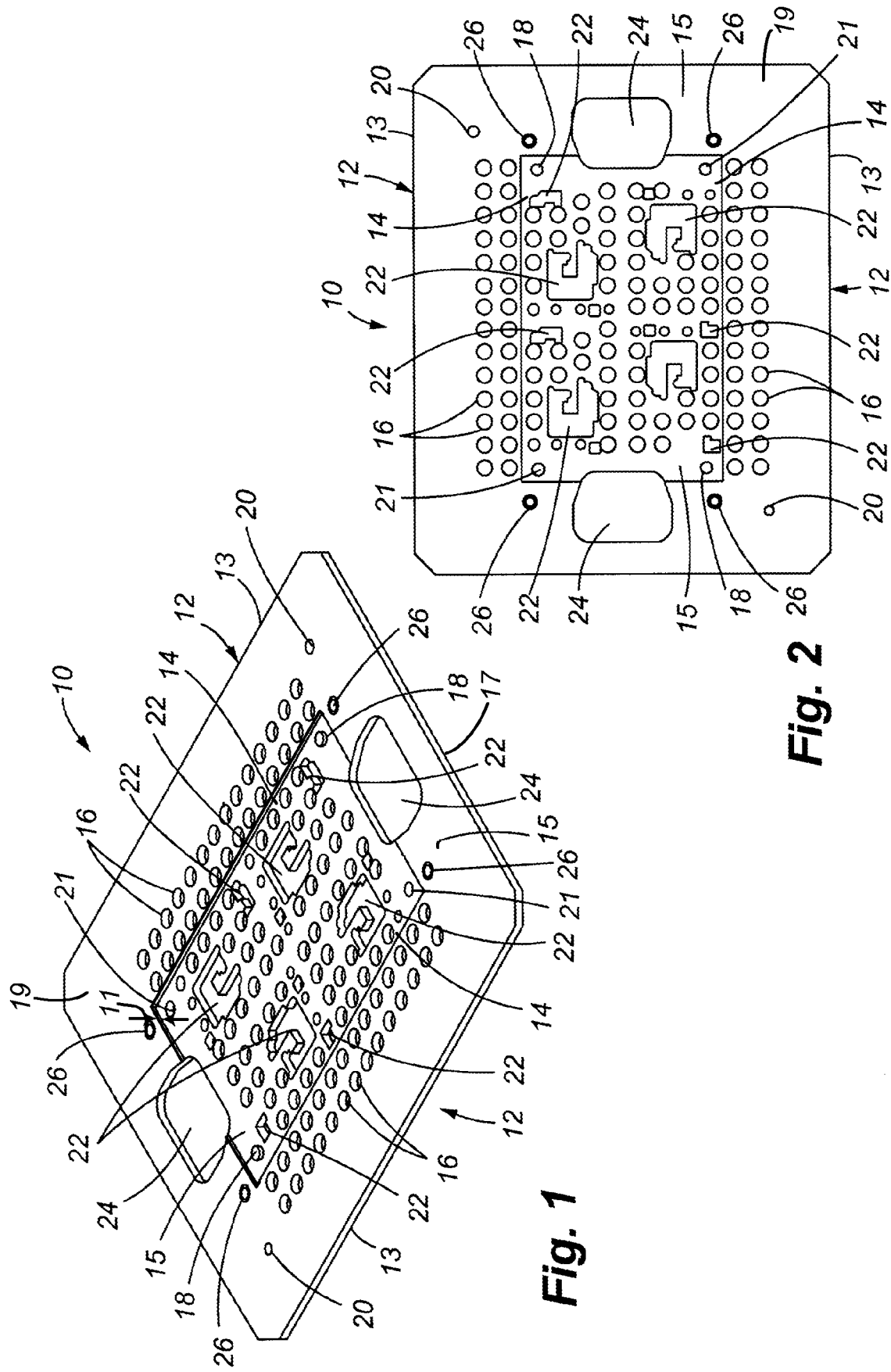

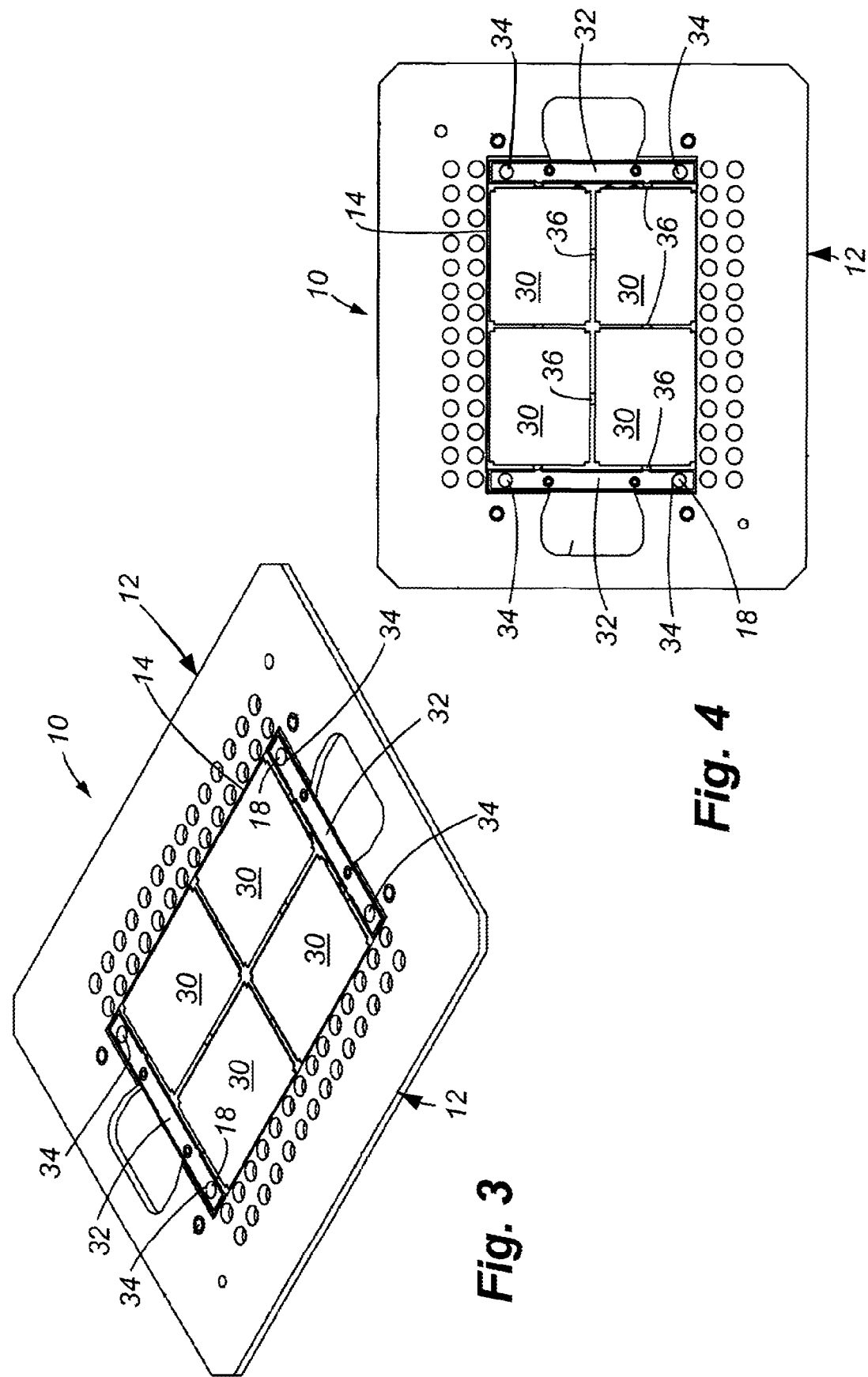

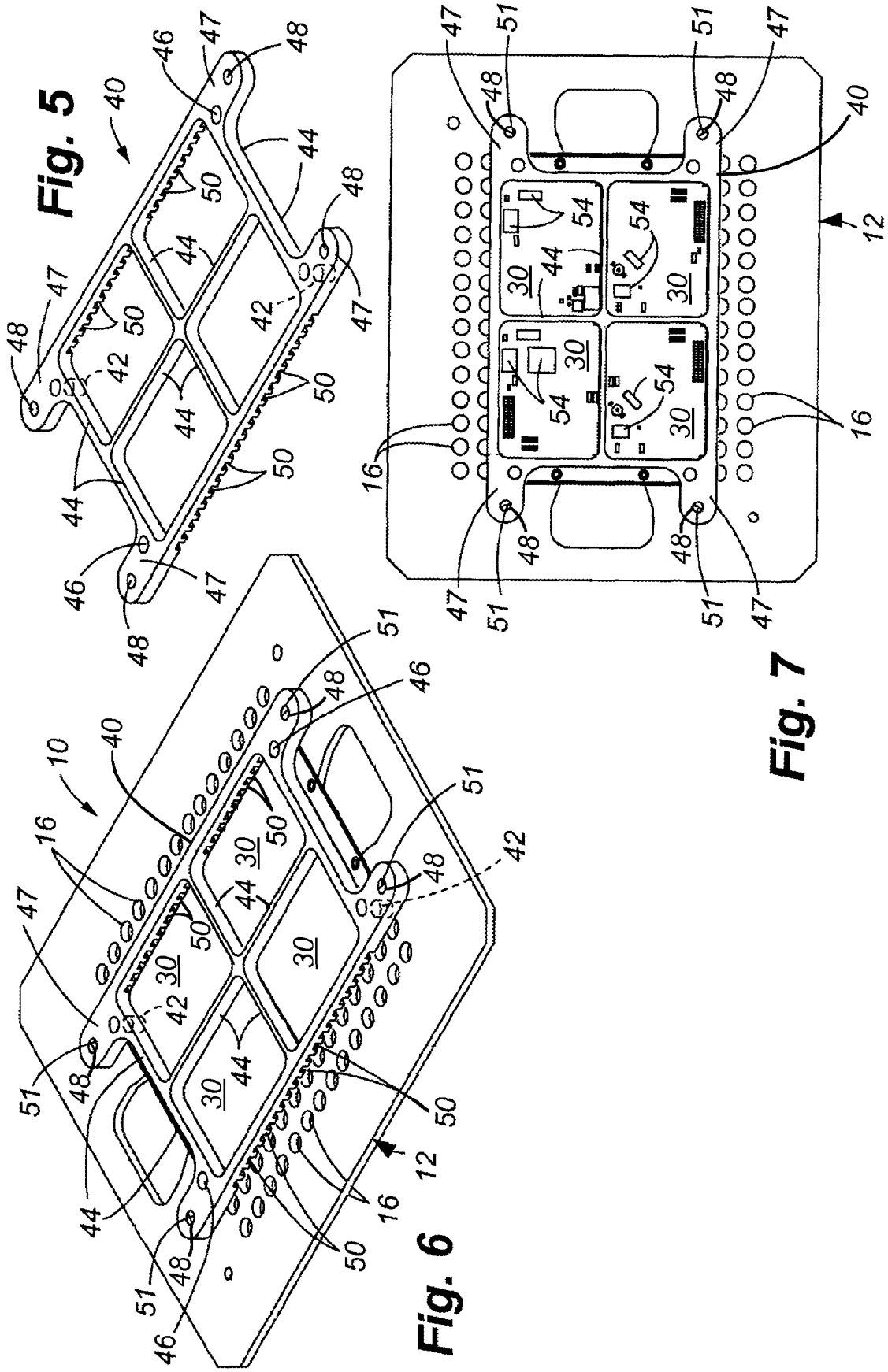

ized group of printed circuit board substrates, the panelized group of printed circuit board substrates is secured to the base plate. A recessed area is provided in an upper surface of the base plate to allow the panelized group of printed circuit board substrates to be secured therein. Solder paste is applied to the panelized printed circuit board substrates. The first top plate is positioned over the base plate to secure each printed circuit board substrate to the base plate such that a first manufacturing process can take place. Once the first manufacturing process is complete, the first top plate is removed and the second top plate is mounted over the base plate such that a second manufacturing process can take place.

SMALL FORM FACTOR PCBA PROCESS CARRIER

CROSS REFERENCE TO RELATED APPLICATIONS

This application claims the benefit of U.S. Provisional Application 60/780,238 filed on Mar. 8, 2006 entitled "SMALL FORM FACTOR PCBA PROCESS CARRIER," the entire disclosure of which is hereby incorporated by reference in its entirety.

BACKGROUND

Printed circuit board assemblies (PCBAs) are used to mechanically support and electrically connect electronic components by conductive pathways or traces formed in the circuit boards. Printed circuit boards are constructed of nonconductive substrate layers and copper sheets laminated onto the nonconductive layers. The conductive pathways are etched in the copper sheets by removing the nonconductive substrate at specified locations. The electronic components that are mounted to the substrate are referred to as surface mounted devices (SMDs). Two common processes for mounting SMDs include infrared and vapor phase reflow. The primary steps in most reflow processes include flux activation, melting the solder particles in the solder paste, wetting the surfaces to be joined, and solidifying the solder into a strong metallurgical bond. Once the circuit board is populated with the SMDs, the PCBA is formed.

PCBAs are used in data storage systems, such as disc drives, as well as in other electronic systems. As disc drives have progressed over time, one goal in disc drive design has been to make the disc drive smaller so the disc drive can be used in smaller products. Today, disc drives are used in a number of relatively small electronic devices such as video cameras, digital music players, cell phones, portable game players and even some toys. As disc drives become smaller, the corresponding electronic components, conductive traces and nonconductive substrates of PCBAs have also become much smaller. In a disc drive, the PCBA is typically mounted to a base of the disc drive. Various miniaturization techniques have been developed with respect to the manufacture of PCBAs such that complex PCBAs can now be found in sizes as small as one inch in length and width. These small circuit boards can be referred to as small form factor PCBAs.

Small form factor PCBAs have become increasingly fragile due to their reduction in thickness. The size of the SMDs, as well as the conductive traces and solder connections have also decreased in size, thus adding to their fragility. Currently, small form factor PCBAs can be processed together as a panelized group, and then are separated from one another during testing. Handling of these small form factor PCBAs between various manufacturing and testing process steps can be one of the leading causes of PCBA damage. For example, the slightest incidental twisting of a PCBA when handled can cause delaminating of circuit board layers and/or fracturing of solder joints. Such delaminating of layers and fracturing of solder joints lead to PCBA failure.

SUMMARY

A process carrier is provided for supporting and securing printed circuit boards during manufacturing and testing. The process carrier includes a base plate, a first top plate, and a second top plate. After the conductive traces have been formed in a group of panelized printed circuit board sub- These and various other features and advantages will be apparent from a reading of the following Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

FIG. 1 is a top perspective view of a base plate of a process carrier for supporting printed circuit board substrates for the manufacture of printed circuit board assemblies under one embodiment.

FIG. 2 is a plan view of an upper surface of the base plate illustrated in FIG. 1.

FIG. 3 is a top perspective view of the base plate of FIG. 1 supporting a panelized group of printed circuit board substrates.

FIG. 4 is a top plan view of FIG. 3.

FIG. 5 is a top perspective view of a first top plate of a process carrier under one embodiment.

FIG. 6 is a top perspective view of the first top plate of FIG. 5 mounted to the base plate of FIGS. 1-4.

FIG. 7 is a top plan view of FIG. 6 including surface mount devices (SMDs) coupled to each of the panelized group of printed circuit board substrates.

DETAILED DESCRIPTION

Figure 8:
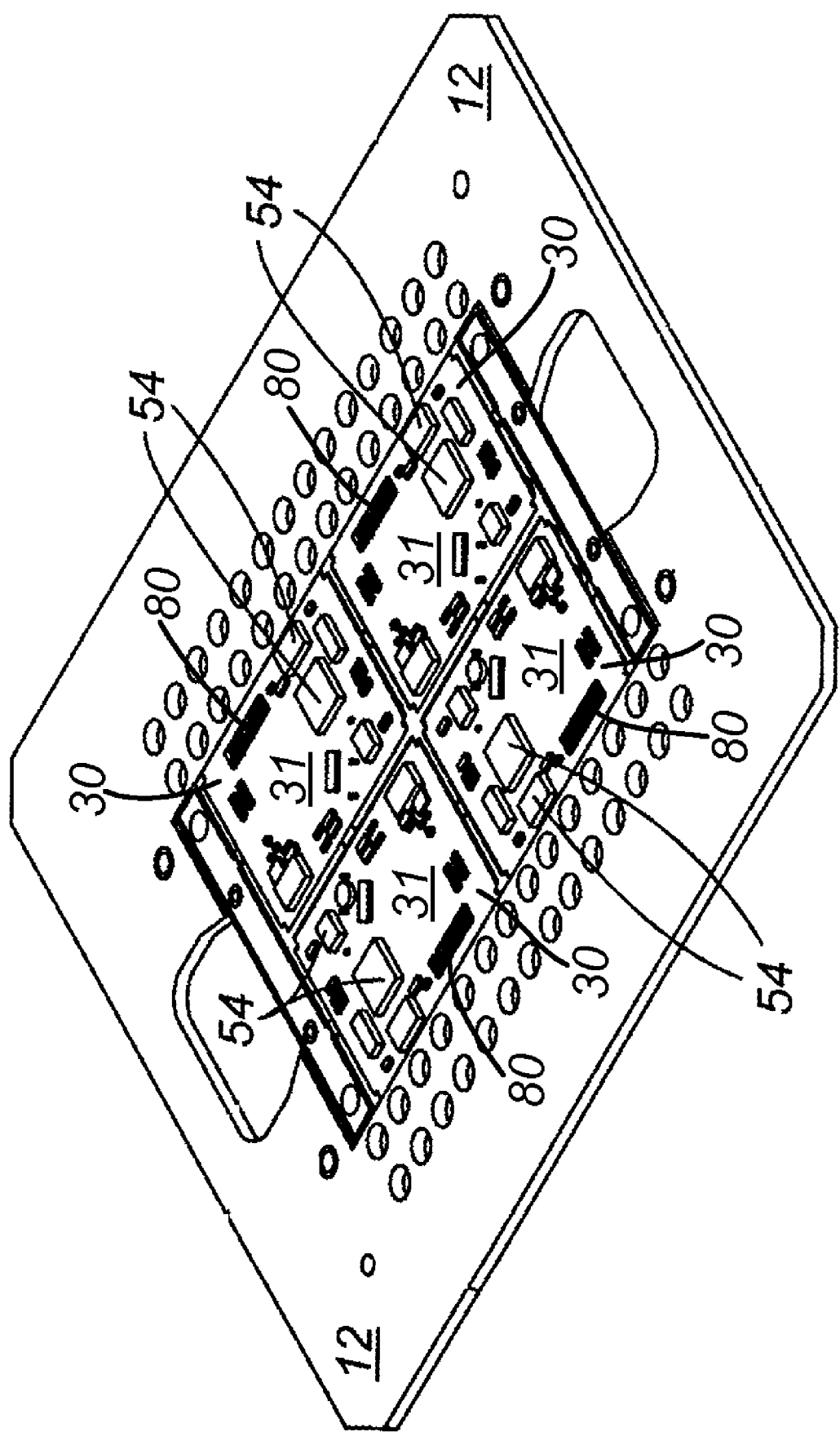
FIG. 8 is a top perspective view of the base plate of FIGS. 1-4 including the panelized group of printed circuit board substrates after the first top plate is removed.

Embodiments of the disclosure relate to the manufacturing and testing of printed circuit board assemblies (PCBAs). In particular, a process carrier is described for use in manufacturing of the PCBAs. The process carrier supports printed circuit board (PCB) substrates as they undergo manufacture into PCBAs. In particular, the process carrier supports a panelized group of PCB substrates. A panelized group of PCB substrates includes a plurality of PCB substrates that are attached to each other by bridges. After manufacture, each PCBA will be detached from each other such that each PCBA can be used in a data storage system.

In one embodiment, FIGS. 1 and 2 illustrate a top perspective view and a top plan view, respectively, of a base plate 12 of a process carrier 10. The process carrier 10 comprises three major components, namely, the base plate 12, a first top plate 40 (illustrated at least in FIG. 5) and a second top plate 60 (illustrated at least in FIG. 9). Glass composites, such as Durapol®, are example materials that can be used for the process carrier 10. These materials are non-conductive, heat resistant and durable. In particular, Durapol® is easily machinable.

The base plate 12 is a substantially planar member defined by a peripheral edge 13, an upper surface 15 and a lower surface 17. The base plate 12 includes a recessed area or pocket 14 formed on the upper surface 15 of the base plate. The recessed area 14 includes a depth 11 that is substantially equal to a thickness of panelized group of PCB substrates 30. The base plate 12 also includes a plurality of perforations 16 that extend between the upper surface 15 and the lower surface 17 of the base plate 12. The plurality of perforations 16 are positioned in recessed area 14 and a remaining non-recessed area 19 of the upper surface 15. Each of the plurality of perforations 16 are of similar size and geometric shape and are formed in a uniform pattern. A panelized group of PCB substrates (illustrated in FIGS. 3 and 4) fit within recessed area 14 such that upper surfaces of the panelized group of PCB substrates are co-planer with the upper surface 15 in the non-recessed area 19 of the base plate 12.

A pair of tooling pins 18 are positioned on the upper surface 15 within recessed area 14. The pair of tooling pins 18 are used to secure the panelized PCB substrates, which will be discussed below in association with FIG. 3. The pair of tooling pins 18 are located at diagonal ends of the recessed area 14 of the base plate 12. The upper surfaces of tooling pins 18 are co-planner with the upper surface 15 of the non-recessed area 19 of the base plate 12.

A pair of locating holes 20 extend between the upper surface 15 and the lower surface 17 in non-recessed area 19 of base plate 12. The pair of locating holes 20 are located at diagonal ends of the base plate 12. Locating holes 20 can be used to secure base plate 12 to tooling used in machines for manufacturing and testing procedures. Additional locating holes can be provided as necessary or placed at other locations in order to allow base plate 12 to be secured in a particular piece of manufacturing or testing equipment.

The base plate 12 includes a pair of top plate receiving holes 21 formed in the upper surface 15 of the recessed area 14. The top plate receiving holes 21 are located at diagonal ends of the recessed area 14 opposite of the diagonal ends of the tooling pins 18. The top plate receiving holes 21 are configured to receive tooling pins from a top plate (as will be further discussed in FIGS. 5-7 and 9-11). A plurality of test point openings 22 are also formed in the base plate 12 that extend from the upper surface 15 of the recessed area 14 to the lower surface 17. The plurality of test point openings 22 are shaped to match a shape of test pads included in each formed PCBA. As further described below with respect to FIG. 12, the test point openings 22 are positioned such that test pads on formed PCBAs can be accessed. The test point openings 22 enable testing of the PCBAs, while the panelized group of formed PCBAs remain supported by the base plate 12.

The base plate 12 also includes a pair of handle openings 24 to enable the base plate to be handled once manufacturing and testing of the PCBAs is complete, or if it is otherwise necessary to handle the base plate for shipment, storage and etc. The base plate 12 also includes four holes 26 with threaded inserts placed therein. The holes 26 are located in the non-recessed area 19 of the base plate 12. The holes 26 enable the first top plate 40 and the second top plate 60 to be alternatively secured to the base plate 12, as will be discussed further below.

FIGS. 3 and 4 illustrate an example of a panelized group of PCB substrates 30 secured to the base plate 12. It should be noted that other configurations of a panelized group of PCB substrates can be provided and can follow a similar structure as that which is described below. The exemplary panelized group of PCB substrates 30 are connected to one another by various bridges, and, as best seen in FIG. 4, these bridges are shown as connection tabs 36. A pair of end tabs 32 are located at opposite ends of the panelized group of PCB substrates 30. The end tabs 32 are also interconnected to the respective PCB substrates 30 by connection tabs 36. Each of the end tabs 32 includes a pair of openings 34 that align with the tooling pins 18. Thus, when the panelized group of PCB substrates 30 are set within the recessed area 14 and the tooling pins 18 of the base plate 12 are received by the openings 34, the PCB substrates are prevented from shifting.

The panelized group of PCB substrates 30 shown in FIGS. 3 and 4 do not yet have surface mounted devices (SMDs) mounted thereto to form PCBAs. Furthermore, the PCBA substrates 30 illustrated in FIGS. 3 and 4 do not show the various etched electrical trace patterns in order to simplify viewing of the PCB substrates. When the PCB substrates 30 are prepared to receive the SMDs, the base plate 12 first passes through a manufacturing/processing station which adds solder paste to the PCBA substrates.

Next, a first top plate 40 is mounted to the base plate 12, as shown in FIGS. 5-7. The first top plate 40 comprises a pattern of rails or braces 44 that extend along the peripheral edges of each of the PCB substrates 30. The braces 44 provide room for the SMDs to be placed on the respective substrates. As shown, for an example group of four panelized PCB substrates 30, there are a pair of side rails, a pair of end rails, and four crossing interior rails. A pair of tooling pins 42 extend from diagonally opposing ears 47 that are formed at the corners of the first top plate 40. The tooling pins 42 are received in the corresponding top plate receiving holes 21 formed in the base plate 12, thereby enabling the first top plate 40 to rest on the panelized group of PCB substrates 30. Additional tooling pin holes 46 are also provided in the first top plate 40. The tooling pin holes 46 of the first top plate 40 are configured to receive tooling pins 18 located at diagonal ends of recessed area 14 of base plate 12. It should be noted that the arrangement of the tooling pins 42 and the tooling pin holes 46 should correspond with the arrangement of the tooling pins 18 and the top plate receiving holes 21. For example, if the location of the tooling pins 18 were reversed and placed at the opposite diagonal ends of the base plate 12, then the tooling pins 42 of the first top plate 40 should also be placed at the opposite diagonal ends of the first top plate in order to allow the first top plate to be secured to the base plate. The lower surfaces of the side rails 44 have a plurality of notches 50 formed thereon which promote air flow around the panelized PCBA substrates 30. The notches 50 could also be formed on the interior rails and the end rails, thereby promoting further air flow. Screw holes 48 are formed on each of the ears 47. Screws 51 are placed through the screw holes 48 and are secured within the holes 26 including the threaded inserts.

Once the first top plate 40 is positioned and secured to the base plate 12, placement of surface mounted devices (SMDs) 54 can occur. As shown in FIG. 7, some of the SMDs 54 are shown mounted to the respective PCB substrates 30. It should be noted that the rails 44 separate each of the PCBA substrates 30 into separate compartments. During placement of the SMDs 54, a certain amount of pressure is exerted upon the panelized PCB substrates 30 by the machinery that "picks and places" the SMDs 54. However, since the panelized PCB substrates 30 are tightly secured between the base plate 12 and the rails of the top plate 40, no sliding or displacement of the panelized PCB substrates can occur which otherwise would result in improper placement of the SMDs 54. Once each of the SMDs 54 are placed upon their respective PCB substrate 30, an infrared reflow process can occur, which results in solidifying the solder into a strong metallurgical bond. It should be noted, however, that an infrared reflow process is an exemplary process and that other types of processes can be used to solidify the solder into a strong metallurgical bond. When utilizing the exemplary infrared reflow process, the base plate 12 is exposed to high temperatures. The plurality of perforations 16 along with the open top arrangement of the first top plate 40 and the notches 50 formed on the lower surfaces of the first top plate promote air flow through the base plate 12 and around the panelized PCB substrates 30.

FIG. 8 illustrates the base plate 12 after the exemplary infrared reflow process or other type of process. Therefore, each panelized PCB substrate 30 has their SMDs 54 mounted thereon to form printed circuit board assemblies (PCBAs) 31. In addition, FIG. 8 illustrates each PCBA 31 including an electrical connector 80.

Figure 9:
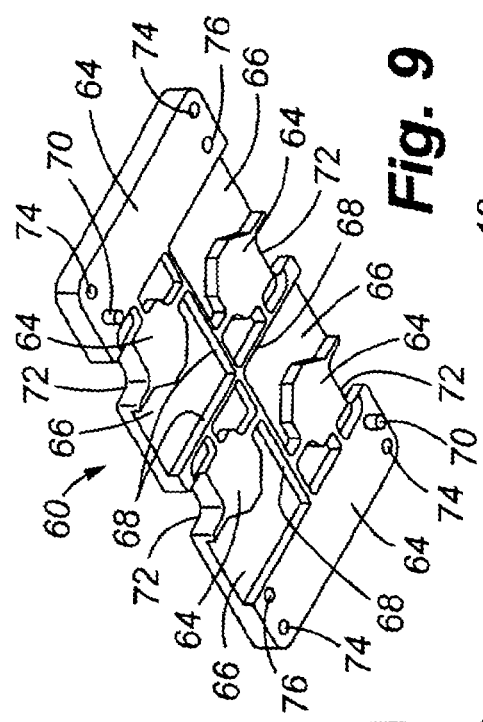
FIG. 9 is a bottom perspective view of a second top plate of a process carrier under one embodiment.
Figure 11:
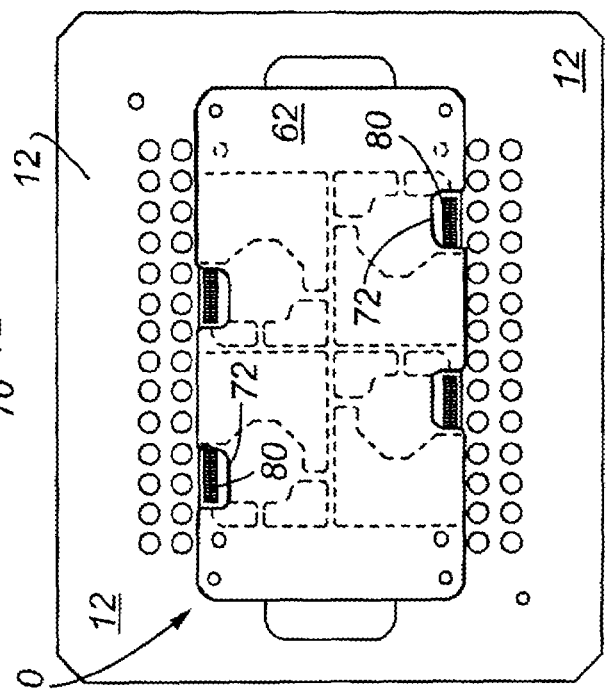
FIG. 11 is a top plan view of FIG. 10.
Figure 10:
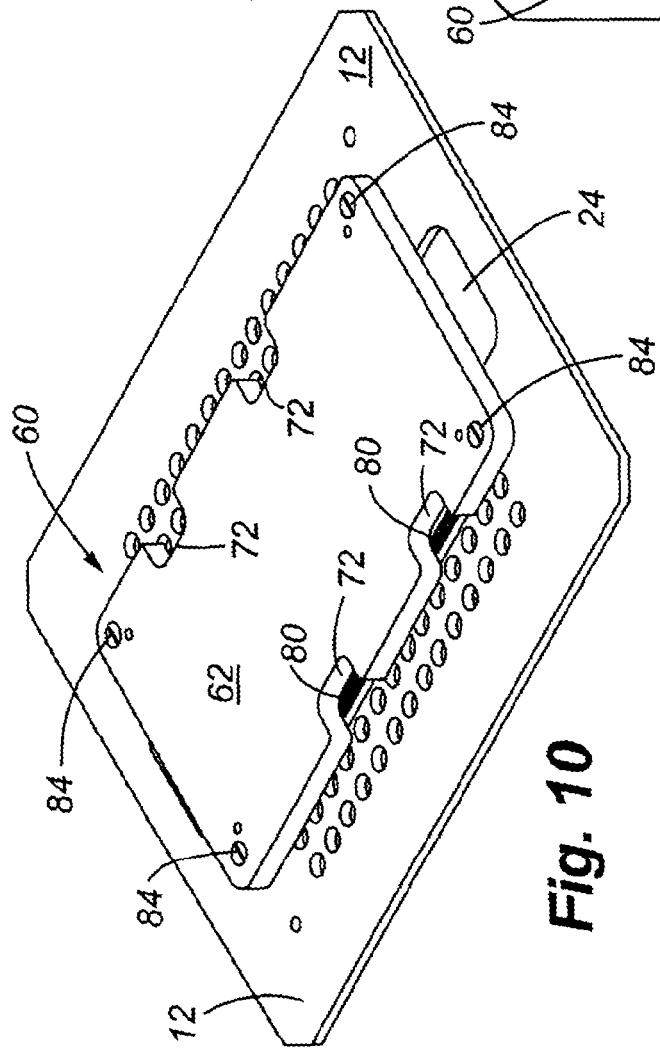
FIG. 10 is a top perspective view of the second top plate of FIG. 9 mounted to the base plate of FIGS. 1-4.

A second top plate 60 is illustrated in FIG. 9. FIGS. 10 and 11 illustrate a top perspective view and a top plan view, respectively, of the second top plate 60 mounted to the base plate 12. The second top plate 60 is used as a protective covering over the upper surfaces of the panelized PCBAs 31 in order to protect the SMDs 54 and the various electrical traces. The second top plate 60 is defined by an upper surface 62, a lower surface 64 and a group of separating walls 68 that segregate the four PCBAs 31 from one another. The upper surface 62 of the second top plate 60 is a continuous surface. Within each of the segregated spaces defined by walls 68, cavities 66 are formed on the lower surface 64 in order to accommodate space for the protruding SMDs 54. In order to correctly position the second top plate 60, tooling pins 70 protrude from the lower surface 64 of the second top plate. These tooling pins 70 are received in the same top plate receiving holes 21 on the base plate 12 that previously received the tooling pins 42 from the first top plate 40. In addition, the second top plate 60 also includes tooling pin holes 76 configured to receive the same tooling pins 18 that tooling pin holes 46 of the first top plate 40 received. Again, it should be noted that the arrangement of tooling pins 70 and tooling pin holes 76 should correspond with the arrangement of tooling pins 18 and top plate receiving holes 21. For example, if the location of the tooling pins 18 were reversed and placed at the opposite diagonal ends of the base plate 12, then the tooling pins 70 of the second top plate 60 should also be placed at the opposite diagonal ends of the second top plate in order to allow the second top plate to be secured to the base plate 12.

The second top plate 60 also includes reliefs 72 formed on the outer perimeter that allow the respective connectors 80 of the PCBAs 31 to be exposed for testing. The second top plate 60 is secured to the base plate 12 by screws 84 that are placed through screw holes 74 positioned in second top plate 60 and received in the holes 26 including the threaded inserts of the base plate. Once the second top plate 60 is secured, the PCBAs 31 are again prepared for another step in manufacturing and/or testing. The PCBAs 31 are encapsulated between the base plate 12 and the second top plate 60, thereby preventing the PCBAs 31 from being damaged, such as by twisting.

Figure 12:
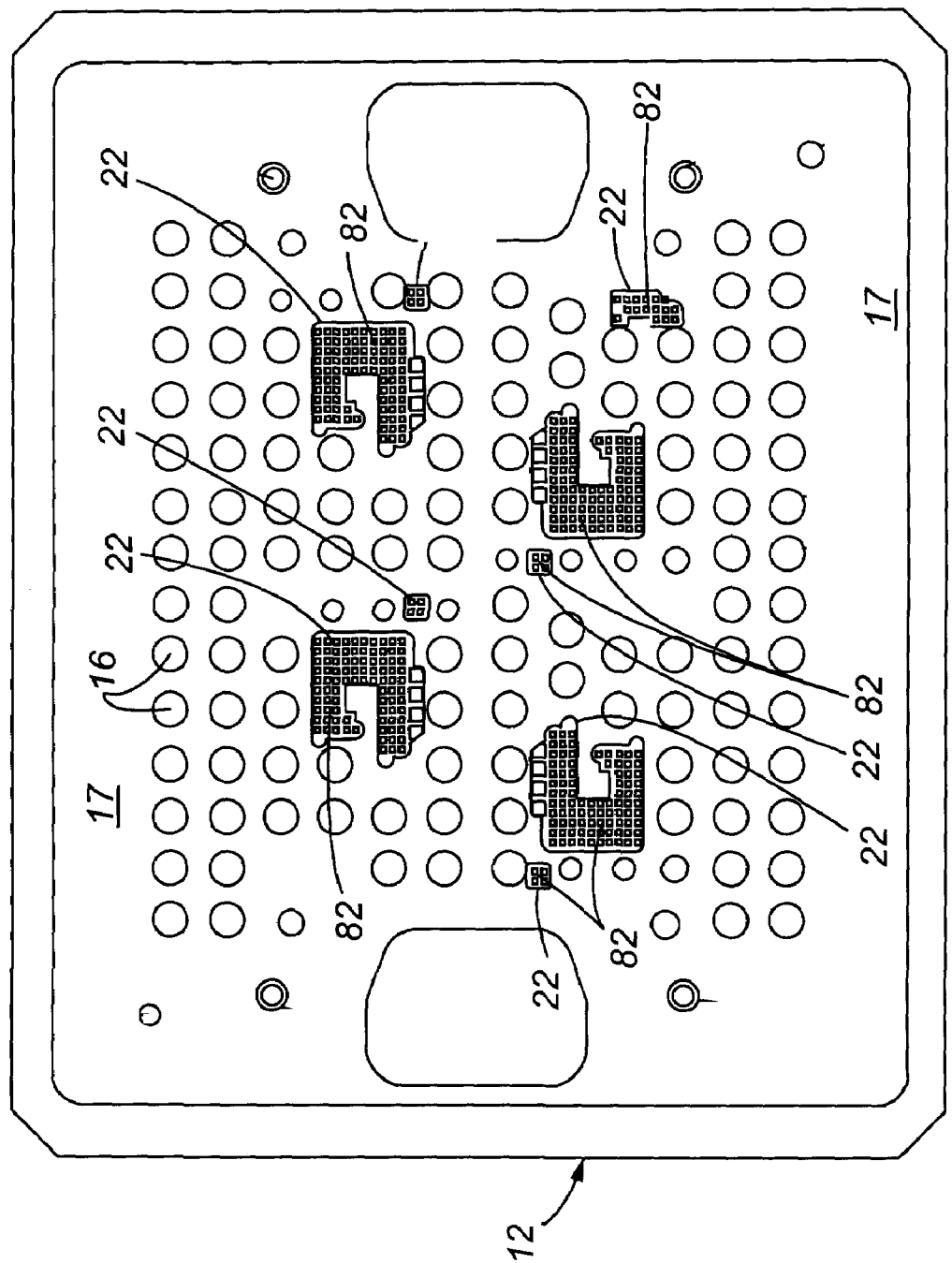
FIG. 12 is a bottom plan view illustrating the bottom surface of the base plate illustrated in FIGS. 10 and 11.

Referring to FIG. 12, the lower surface 17 of the base plate 12 is shown. The test point openings 22 expose the test pads 82 formed on the lower surfaces of the PCBAs 31. The test pads 82 allow the "pogo pins" of a testing machine to conduct the necessary testing of the PCBAs. Thus, the process carrier 10 allows the PCBAs 31 to be mounted to the same carrier during testing as was used during manufacture.

In accordance with the method of the present invention, a method of manufacturing and testing PCBAs in a single carrier includes: (1) placement of a group of panelized PCB substrates in a base plate; (2) applying solder paste to the PCB substrates; (3) placing a first top plate over the base plate to secure the panelized PCBA substrates; (4) conducting the necessary "pick and place" process to attach SMDs to the PCB substrates to form PCBAs; (5) conducting an infrared reflow process or similar process, such as a vapor phase reflow process, in order to solidify the solder; (6) removing the first top plate and replacing it with a second top plate; and (7) conducting PCBA testing while the PCBAs are still secured to the base plate. With respect to applying solder paste, it shall be understood that this step could occur after the placement of the first top plate over the base plate. The testing step can occur after the placement of the second top plate over the base plate. Testing can be accomplished using the exposed test pads through the lower surface of the base plate as well as testing via exposed electrical connectors through the second top plate.

Once the PCBAs have passed various tests, the PCBAs are transferred to a board mate station where the PCBAs are depanelized and installed on the particular device on which they are to be used. With respect to disc drives, they are installed on their respective disc housings and the installed PCBAs then undergo drive level test processing. The base plate and top plates can be returned to the beginning of the manufacturing assembly process for reuse.

Although embodiments of the disclosure illustrate an arrangement of four panelized PCBAs, it is contemplated that the base plate as well as the first top plate and the second top plate can be configured to handle other alternate configurations of PCBAs. For example, less than four or more than four PCBAs may be provided in a panelized configuration, and the base plate and top plates can be made larger or smaller in size to accommodate particular PCBA configurations.

There are a number of advantages of the present invention. Increasingly fragile PCBAs can be protected through various manufacturing and testing processes by a single carrier that secures groups of panelized PCBAs. Thus, common causes of damage such as incidental twisting of the boards can be prevented. The carrier protects the board and serves as both an assembly and test platform. The process carrier of the present invention provides a solution for handling PCBAs through many manufacturing and testing processes, thereby reducing the costs and logistics of using a variety of different process carriers for different processing steps. The process carrier is also low profile to allow compact stacking for transport of multiple panelized PCBAs.

Although the process carrier is described as having three primary components, it shall be understood that depending upon when the process carrier is being used during manufacturing or testing of the PCBAs, only two of the three components are used simultaneously. Therefore, it shall be understood that embodiments include use of the base plate with the first top plate alone, and use of the base plate with the second top plate alone. It shall also be understood that the base plate alone serves as an embodiment having utility, such as during application of solder paste.

It is to be understood that even though numerous characteristics and advantages of various embodiments of the disclosure have been set forth in the foregoing description, this disclosure is illustrative only, and changes may be made in detail, especially in matters of structure and arrangement of parts within the principles of the disclosure to the full extent indicated by the broad general meaning of the terms in which the appended claims are expressed. For example, the particular elements may vary depending on the particular application of the process carrier while maintaining substantially the same functionality without departing from the scope and spirit of the disclosure. In addition, it should be appreciated by those skilled in the art that the teachings of the disclosure can be applied to various types of small electronic devices, such as data storage systems, without departing from the scope and spirit of the disclosure.

What is claimed is:

1. A process carrier capable of supporting printed circuit boards during manufacturing and testing, the process carrier comprising:
   a base plate having an upper surface and a lower surface, the upper surface including a recessed area sized to receive a plurality of printed circuit board substrates that are coupled together to form a panelized group;
   a first top plate removably coupled to the upper surface of the base plate during a first manufacturing process, the first top plate including a plurality of connected rails configured to secure the panelized group of printed circuit board substrates; and
   a second top plate removably coupled to the upper surface of the base plate during a second manufacturing process, the second top plate configured to cover the panelized group of printed circuit board substrates.

2. The process carrier of claim 1, wherein the recessed area has a depth substantially equal to a thickness of the panelized group of printed circuit board substrates such that an upper surface of the panelized group of printed circuit board substrates is substantially coplanar with a non-recessed area of the upper surface of the base plate when the panelized group of printed circuit board substrates are received in the recessed area.

3. The process carrier of claim 1, further comprising a plurality of uniformly dispersed perforations extending between the upper surface and the lower surface of the base plate.

4. The process carrier of claim 1, further comprising a plurality of test point openings extending between the upper surface and the lower surface of the base plate to access test pads coupled to the printed circuit board substrates.

5. The process carrier of claim 1, wherein the plurality of rails of the first top plate extend along and secure peripheral edges of each of the panelized group of printed circuit board substrates to the base plate.

6. The process carrier of claim 1, wherein the plurality of connected rails include a lower surface, the lower surface having a plurality of notches formed thereon to promote air flow between the first top plate and the panelized group of printed circuit board substrates.

7. The process carrier of claim 1, wherein the first top plate includes a plurality of openings formed between an upper surface of the rails and the lower surface of the rails and at corners thereof for receiving fasteners to secure the first top plate to the base plate.

8. The process carrier of claim 1, wherein the second top plate comprises a continuous upper surface for covering the panelized group of printed circuit board substrates.

9. The process carrier of claim 8, wherein the second top plate comprises a plurality of cavities formed on a lower surface of the second top plate, wherein each cavity is configured to cover each of the panelized group of printed circuit board substrates located in the recessed area of the upper surface of the base plate.

10. The process carrier of claim 9, wherein the second top plate includes a plurality of openings formed between the upper surface and the lower surface of the second top plate and at corners thereof for receiving fasteners to secure the second top plate to the base plate.

11. The process carrier of claim 1, wherein the first manufacturing process comprises placing surface mount devices to each of the panelized group of printed circuit board substrates and bonding the surface mount devices to each of the panelized group of printed circuit board substrates.

12. The process carrier of claim 11, wherein bonding of the surface mount device includes bonding the surface mount device with an infrared reflow process.

13. The process carrier of claim 1, wherein the second manufacturing process comprises testing each of the printed circuit board substrates having the surface mount devices by accessing test pads on each printed circuit board substrate through test point openings that are formed in the recessed area of the base plate.

14. The process carrier of claim 3, wherein the plurality of perforations are located in the recessed area of the upper surface and located in a non-recessed area of the upper surface.

15. The process carrier of claim 4, wherein the test openings are located in the recessed area of the upper surface.

16. A process carrier capable of supporting printed circuit boards during manufacturing and testing, the process carrier comprising:
   a base plate including:
      a lower surface;
      an upper surface having a recessed area sized to receive a plurality of printed circuit board substrates coupled together to form a panelized group;
      a plurality of perforations extending between the upper surface and the lower surface of the base plate to promote airflow to the printed circuit boards substrates;
      a plurality of test openings extending between the upper surface and the lower surface of the base plate to access test pads on each printed circuit boards substrate; and
   a first top plate removably coupled to the upper surface of the base plate during a first manufacturing process, the first top plate including a plurality of connected rails configured to secure the panelized group of printed circuit board substrates.

17. The process carrier of claim 16, wherein the first manufacturing process comprises placing surface mount devices to each of the panelized group of printed circuit board substrates and bonding the surface mount devices to each of the panelized group of printed circuit board substrates.

18. The process carrier of claim 16, further comprising a second top plate coupleable to the upper surface of the base plate during a second manufacturing process, the second top plate configured to cover the panelized group of printed circuit board substrates.

19. The process carrier of claim 18, wherein the second manufacturing process comprises testing each of the printed circuit board substrates having the surface mount devices by accessing test pads on each printed circuit board substrate through test point openings that are formed in the recessed area of the base plate.

* * * * *